United States Patent
Fetzer

(10) Patent No.: US 6,515,935 B1
(45) Date of Patent: Feb. 4, 2003

(54) METHOD AND APPARATUS FOR REDUCING AVERAGE POWER IN MEMORY ARRAYS BY SWITCHING A DIODE IN OR OUT OF THE GROUND PATH

(75) Inventor: Eric S Fetzer, Longmont, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/032,963

(22) Filed: Oct. 19, 2001

(51) Int. Cl.[7] .................................................. G11C 5/14
(52) U.S. Cl. ......................................................... 365/227
(58) Field of Search ................................. 365/226, 227, 365/228, 229

(56) References Cited

U.S. PATENT DOCUMENTS

| | | | | |
|---|---|---|---|---|
| 5,251,179 A | * | 10/1993 | Wittman | 365/227 |
| 5,307,318 A | * | 4/1994 | Nemoto | 365/226 |
| 5,373,474 A | * | 12/1994 | Miyaoka | 365/208 |
| 5,734,618 A | * | 3/1998 | Mizuta | 365/227 |
| 6,314,041 B1 | * | 11/2001 | Frey | 365/227 |

* cited by examiner

Primary Examiner—Tan T. Nguyen
(74) Attorney, Agent, or Firm—John R. Pessetto

(57) ABSTRACT

A circuit for reducing power in SRAMS and DRAMS is implemented by dynamically controlling a voltage applied to individual memory sections of a semiconductor memory array. Individual sections of memory are isolated from a fixed power supply by inserting one or more NFETs and diodes between GND and a negative connection of an individual memory section. The voltage applied to each memory section is controlled by applying a separate variable voltage to each gate of all NFETs connected to a particular memory section. If a memory section is not accessed, the voltage to that section can be lowered, saving power. If a memory section is accessed, the voltage to that section may be raised, providing more power and shortening read and write times.

12 Claims, 2 Drawing Sheets

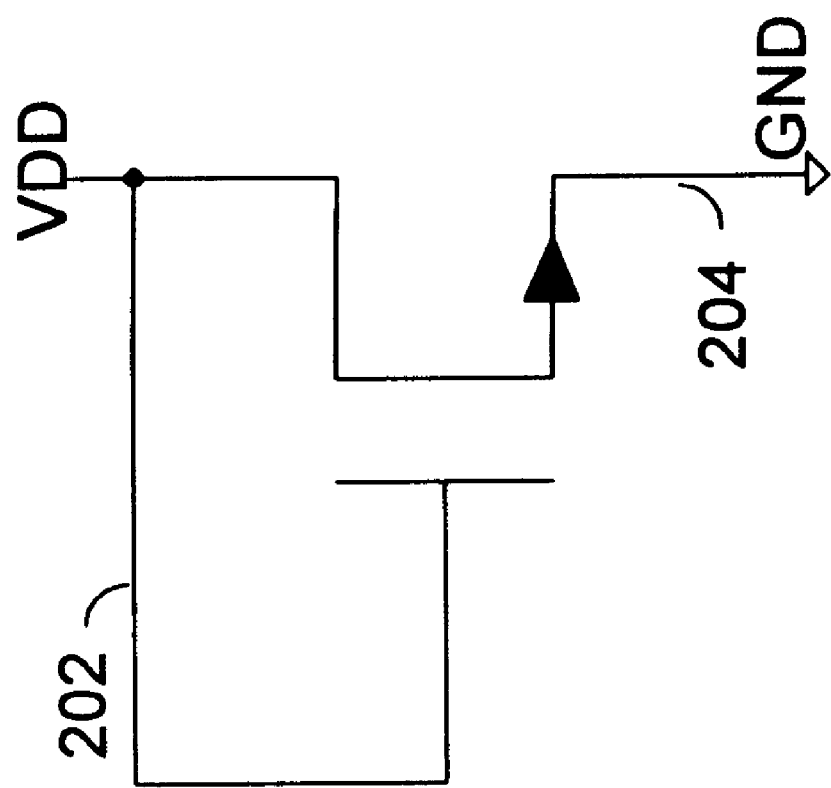

METHOD AND APPARATUS FOR REDUCING AVERAGE POWER IN MEMORY ARRAYS BY SWITCHING A DIODE IN OR OUT OF THE GROUND PATH

FIELD OF THE INVENTION

This invention relates generally to electronic circuits. More particularly, this invention relates to reducing average power in RAM arrays.

BACKGROUND OF THE INVENTION

As more electronic circuits are included on a single die, the power dissipated by a single die continues to increase. In order to keep the temperature of a single IC (integrated circuit) at a reasonable temperature, many techniques have been used to cool the IC. For example, elaborate cooling fins have been attached to the substrate of ICs. Also, fans have been positioned near a group of IC's to cool them. In some cases, liquids have been used to reduce the heat produced by ICs. These solutions can be costly and may require a great deal of space, where space is at a premium. If the power on ICs can be reduced while still achieving higher levels of integration, the cost and area of devices that use ICs may be reduced.

The number of bits contained on a semiconductor memory chip, has, on average, quadrupled every three years. As a result, the power that semiconductor memories consume has increased. Computer systems can use large numbers of stand-alone semiconductor memories. Part of the semiconductor memory used by these computer systems, may be held in standby mode for a certain amount of time. The portion of memory that is held in standby is not accessed for data and as result, has lower power requirements than those parts of semiconductor memory that are accessed. The sections of memory that are not being accessed can be monitored. After identifying memory sections that are not being accessed, the power in these sections may be lowered by reducing the voltage applied to them. When sections of memory are being accessed, the voltage may be increased resulting in shorter read and write times. In this manner, power may be directed to sections of memory that may benefit from a higher voltage and power may be directed away from sections that may not need as much power. The following description of an apparatus and method for controlling the voltage applied to individual memory arrays addresses a need in the art to reduce power in ICs and computer systems while maintaining performance requirements.

SUMMARY OF THE INVENTION

An embodiment of the invention provides a circuit for controlling power in individual memory arrays of a semiconductor memory. Individual arrays of memory of a semiconductor memory are isolated from a fixed power supply by inserting one or more NFETs and diodes between GND and the negative connection of an individual memory section. The voltage applied to each memory array is controlled by applying a separate variable voltage to each gate of all NFETs connected to a particular memory array. If a memory array is not accessed, the voltage to that section can be lowered, saving power. If a memory array is accessed, the voltage to that section may be raised, providing more power and shortening read and write times. This invention fills a need to reduce overall power on a semiconductor chip while at the same time allowing faster access times.

Other aspects and advantages of the present invention will become apparent from the following detailed description, taken in conjunction with the accompanying drawing, illustrating by way of example the principles of the invention.

BRIEF DESCRIPTION OF THE DRAWINGS

FIG. 2 is a schematic drawing of a NFET connected to function as a diode.

DETAILED DESCRIPTION OF THE PREFERRED EMBODIMENT

Figure 1:
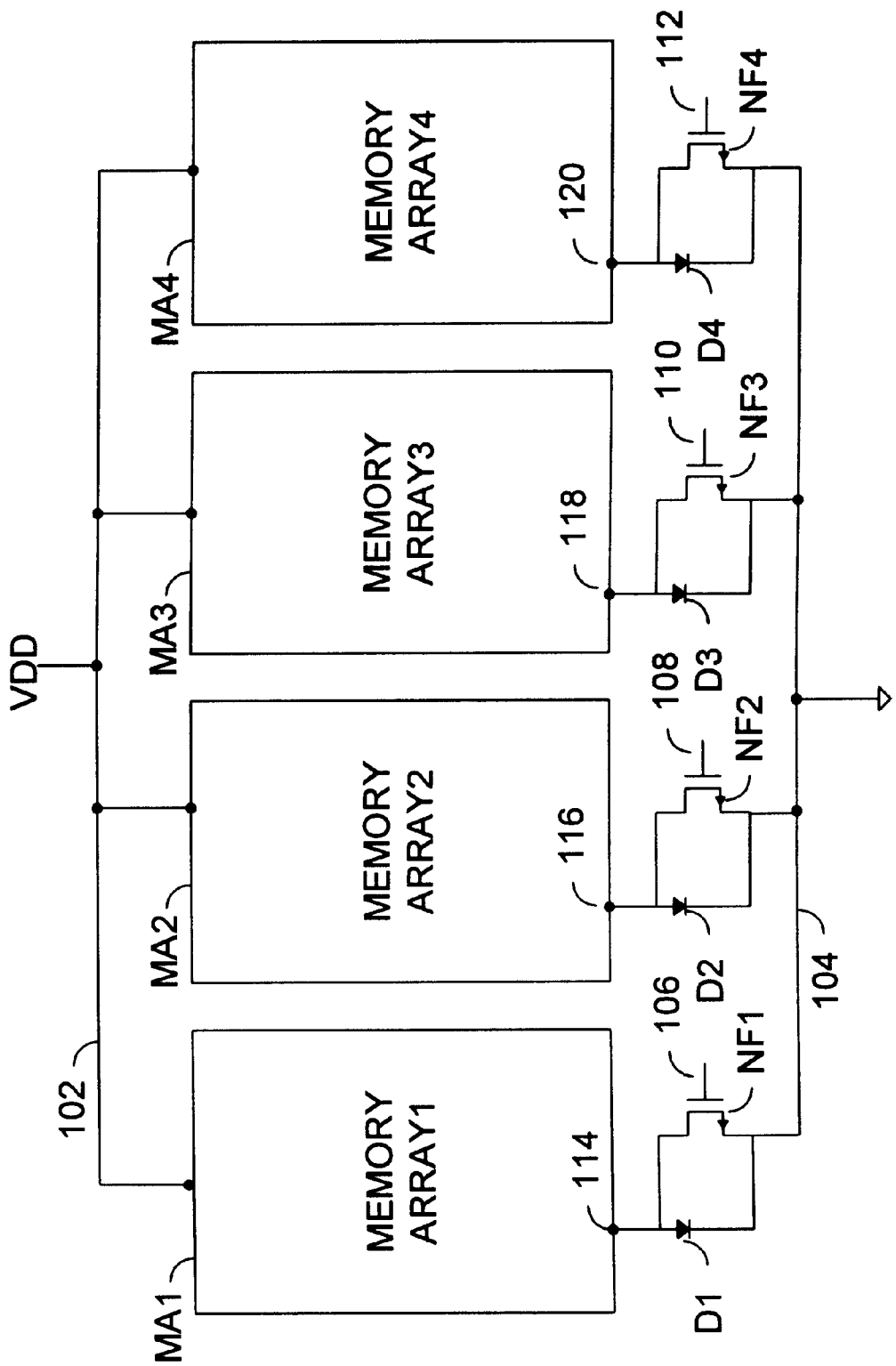
FIG. 1 is a schematic drawing of semiconductor memory elements connected to GND through controlled NFETs and diodes in parallel.

FIG. 1 shows four semiconductor memory arrays, MA1, MA2, MA3, and MA4 connected to a negative power supply, 104 through four NFETs, NF1, NF2, NF3 and NF4 and four diodes, D1, D2, D3, and D4. In this example, the sources of NFETs NF1, NF2, NF3, and NF4, and the cathodes of diodes D1, D2, D3, and D4 are electrically connected to GND, 104. The gate of NF1 is connected to node 106. Node 106 is driven by a variable voltage source. The gate of NF2 is connected to node 108. Node 108 is driven by a variable voltage source. The gate NF3 is connected to node 110. Node 110 is driven by a variable voltage source. The gate of NF4 is connected to node 112. Node 112 is driven by a variable voltage source. The drain of NF1 is connected to node 114. Node 112 is a negative voltage connection to memory array, MA1. The drain of NF2 is connected to node 116. Node 116 is a negative voltage connection to memory array, MA2. The drain of NF3 is connected to node 118. Node 118 is a negative voltage connection to memory array, MA3. The drain of NF4 is connected to node 120. Node 120 is a negative voltage connection to memory array, MA4.

Power may be better utilized by lowering the voltage on selected memory arrays and raising the voltage on other selected memory arrays. For example, if a "high" voltage is applied at node 106, NFET, NF1 will present a low impedance to current flow and as a result, the voltage on negative voltage connection 114, of memory array, MA1 will be near GND. In this case, the diode, D1, will be shorted and the full power supply voltage will be presented to memory array, MA1. When the full power supply voltage is applied to memory array, MA1, the read and write times will be faster than if a lower power supply voltage is applied. However, the power used in this case will be higher.

If the voltage to the gate, 106, of NFET, NF1 is driven to GND, current will no longer flow through NFET, NF1 and current will be conducted through diode, D1. Since the diode, D1, is forwarded biased in this configuration, a voltage drop from node 114 to node 104, GND will occur. The voltage drop will be approximately a threshhold voltage, $V_t$. The magnitude of the $V_t$ depends on the method used to create the diode. One method used is to form a diffusion p/n junction. In this case the $V_t$ is approximately 0.7 volts. Another method used to create a diode is to electrically connect the drain and gate, 202, VDD of an NFET together as shown in FIG. 2 with the source tied to GND, 204. In this case, the $V_t$ can be adjusted to give a lower voltage, approximately 0.35 volts. Either method may be used in this invention. Because the diode drops the voltage by a $V_t$, the voltage applied to memory array MA1 is reduced by a $V_t$. In this case the voltage applied to the memory array, MA1, is (VDD-$V_t$). Since the voltage across MA1 is reduced, it will consume less power and read and write times to this array will be slower than they would have been if a full power supply voltage is applied.

By monitoring which memory arrays are active and which are not active, the power can be adjusted by raising the voltage. on the active arrays and lowering the voltage on the inactive arrays. For example, if memory arrays MA1 and MA2 are active and MA3 and MA4 are inactive, a "high" voltage would be applied to the gates, 106 and 108, and a "low" voltage would be applied to the gates, 110 and 112. This condition supplies the full power supply voltage on memory arrays MA1 and MA2 and lowers the voltage on memory arrays MA3 and MA4 by a $V_t$. Memory arrays MA1 and MA2 may have shorter read and write times and memory arrays, MA3 and MA4 would have lower power. As result, more power is directed to the arrays that may benefit from more power.

FIG. 1 shows the use of one NFET and one diode in parallel for each memory array. This is only an example. One or more NFETs and one or more diodes may be used in each section depending on the power needed and how the memory arrays are physically designed. Also, any device that disables and enables the operation of the diode may be used. For example, a bipolar transistor may be used in parallel with a diode to shut the current away from the diode. In addition, the diode used may be any type (e.g. diffusion P/N junction type or a configured MOSFET).

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for reducing power in a plurality of memory arrays comprising:
   a set of diodes;
   a set of controlled voltage sources;
   a set of NFETs;
   wherein all sources of said set of NFETs and all cathodes of said set of diodes are electrically connected to GND;
   wherein a least one drain of a NFET from said set of NFETs and at least one anode of a diode from said set of diodes is connected to a negative electrical connection of a member of said plurality of memory arrays;
   wherein all members of said plurality of memory arrays are connected to at least one drain of a NFET from said set of NFETs and to at least one anode of a diode from said set of diodes;
   wherein at least one gate of a NFET from said set of NFETs is electrically connected to a member of said set of variable voltage sources.

2. The circuit as in claim 1 wherein said pluralities of memory arrays are SRAM arrays.

3. The circuit as in claim 1 wherein said pluralities of memory arrays are register arrays.

4. A method for reducing power in a plurality of memory arrays comprising:
   controlling voltage to a gate of each NFET of a set of NFETs;
   connecting all sources of said set of NFETs and all cathodes of a set of diodes to GND;
   connecting a least one drain of a NFET from said set of NFETS and at least one anode from said set of diodes to a negative electrical connection of a member of said plurality of memory arrays;
   wherein all members of said plurality of memory arrays are connected to a least one drain of an NFET from said set of NFETs and at least one anode of a diode from said set of diodes.

5. The method as in claim 4 wherein said pluralities of memory arrays are SRAM arrays.

6. The method as in claim 4 wherein said pluralities of memory arrays are register arrays.

7. A circuit for decreasing read and write times in a plurality of memory arrays comprising:
   a set of diodes;
   a set of controlled voltage sources;
   a set of NFETs;
   wherein all sources of said set of NFETs and all cathodes of said set of diodes are electrically connected to GND;
   wherein a least one drain of a NFET from said set of NFETs and at least one anode of a diode from said set of diodes is connected to a negative electrical connection of a member of said plurality of memory arrays;
   wherein all members of said plurality of memory arrays are connected to at least one drain of a NFET from said set of NFETs and to at least one anode of a diode from said set of diodes;
   wherein at least one gate of a NFET from said set of NFETs is electrically connected to a member of said set of variable voltage sources.

8. The circuit as in claim 7 wherein said pluralities of memory arrays are SRAM arrays.

9. The circuit as in claim 7 wherein said pluralities of memory arrays are register arrays.

10. A method for decreasing read and write times in a plurality of memory arrays comprising:
    controlling voltage to a gate of each NFET of a set of NFETs;
    connecting all sources of said set of NFETs and all cathodes of a set of diodes to GND;
    connecting a least one drain of a NFET from said set of NFETS and at least one anode from said set of diodes to a negative electrical connection of a member of said plurality of memory arrays;
    wherein all members of said plurality of memory arrays are connected to a least one drain of an NFET from said set of NFETs and at least one anode of a diode from said set of diodes.

11. The method as in claim 10 wherein said pluralities of memory arrays are SRAM arrays.

12. The method as in claim 10 wherein said pluralities of memory arrays are register arrays.

* * * * *